United States Patent [19]
Katayama et al.

[11] Patent Number: 5,252,988
[45] Date of Patent: Oct. 12, 1993

[54] THERMAL HEAD FOR THERMAL RECORDING MACHINE

[75] Inventors: Hiroyuki Katayama, Fujiidera; Hiroshi Suzuki, Nara; Masato Kawanishi, Habikino; Mitsuhiko Yoshikawa, Ikoma; Toshitaka Tamura, Kashihara; Takatoshi Mizoguchi, Gojo; Hiromi Nishino; Akiyoshi Fujii, both of Nara; Takayuki Taminaga, Yamatokoriyama; Katsuyasu Deguchi, Nara, all of Japan

[73] Assignee: Sharp Kabushiki Kaisha, Osaka, Japan

[21] Appl. No.: 628,845

[22] Filed: Dec. 11, 1990

[30] Foreign Application Priority Data

| Dec. 15, 1989 | [JP] | Japan | 1-326739 |
| Dec. 29, 1989 | [JP] | Japan | 1-342255 |
| Apr. 18, 1990 | [JP] | Japan | 2-104278 |
| May 10, 1990 | [JP] | Japan | 2-120794 |

[51] Int. Cl.$^5$ ............................................. B41J 2/325
[52] U.S. Cl. ............................................. 346/76 PH
[58] Field of Search ............................................. 346/76 PH

[56] References Cited

U.S. PATENT DOCUMENTS

| 4,587,400 | 5/1986 | Kanamori et al. | 346/76 PH |
| 4,750,260 | 6/1988 | Takeno et al. | 346/76 PH |
| 4,768,038 | 8/1988 | Shibata | 346/76 PH |
| 4,845,339 | 7/1989 | Kato | 346/76 PH |
| 5,036,897 | 8/1991 | Tamura et al. | 156/630 |

FOREIGN PATENT DOCUMENTS

| 0413597A1 | 2/1991 | European Pat. Off. . | |
| 0180853 | 9/1985 | Japan | 346/76 PH |
| 61-12357 | 1/1986 | Japan . | |
| 61-181657 | 8/1986 | Japan . | |
| 61-181658 | 8/1986 | Japan . | |
| 62-117760 | 5/1987 | Japan . | |
| 62-164555 | 7/1987 | Japan . | |
| 63-189253 | 8/1988 | Japan . | |
| 64-56566 | 3/1989 | Japan . | |
| 2076747 | 12/1981 | United Kingdom . | |

*Primary Examiner*—Mark J. Reinhart
*Assistant Examiner*—Huan Tran
*Attorney, Agent, or Firm*—Birch, Stewart, Kolasch & Birch

[57] ABSTRACT

A thermal head for a thermal recording machine including an insulating substrate which is composed of a printed circuit board made of a heat resistant resin and covered with a copper film, a plurality of thermal resistors disposed on the insulating substrate in the direction corresponding to the scanning, discrete electrodes electrically connecting first ends of the thermal resistors to a control element, a common electrode electrically connecting the other ends of the thermal resistors together, a heat releasing layer formed of the copper film of the insulating substrate on the lower portions of the thermal resistors, and a thermal accumulating layer of a polyimide resin covering the heat releasing layer.

7 Claims, 15 Drawing Sheets

HEAT RESPONSE CHARACTERISTIC OF THERMAL RECORDING MACHINE WITHOUT HEAT RELEASING SYSTEM

HEAT RESPONSE CHARACTERISTIC OF THERMAL RECORDING MACHINE WITH HEAT RELEASING LAYER AND BACKING METAL LAYER

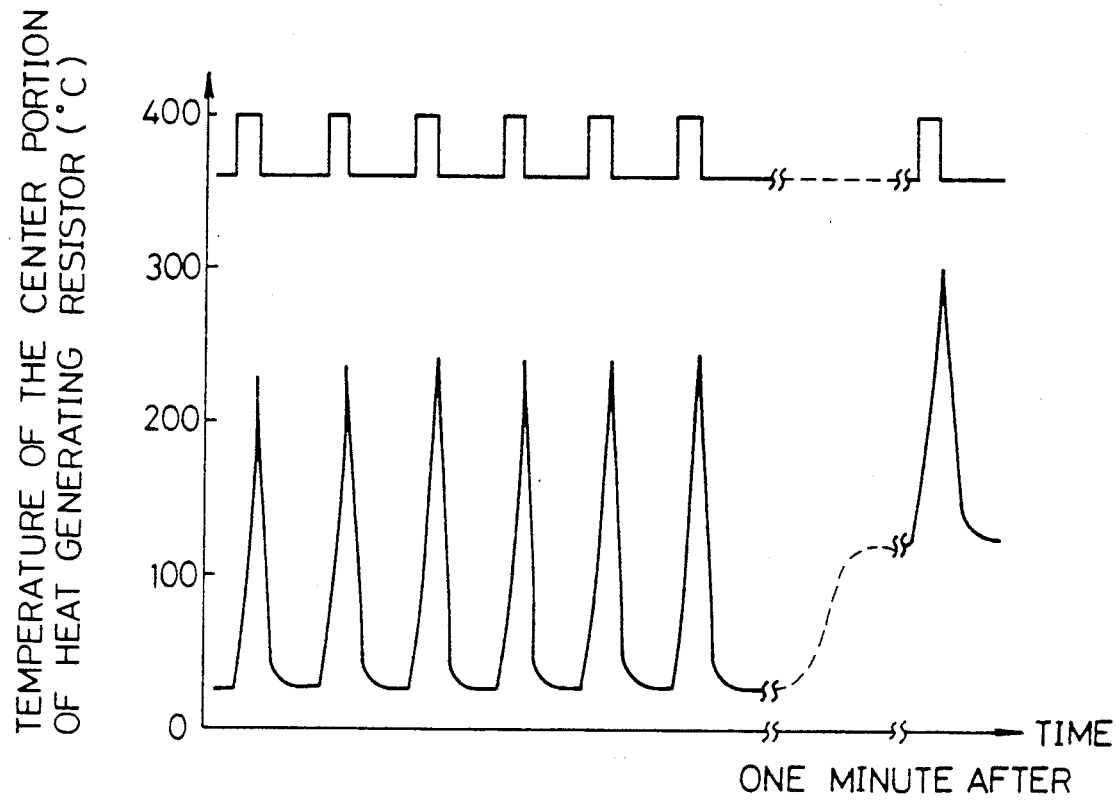
HEAT RESPONSE CHARACTERISTIC OF THERMAL RECORDING MACHINE WITH HEAT RELEASING LAYER ALONE

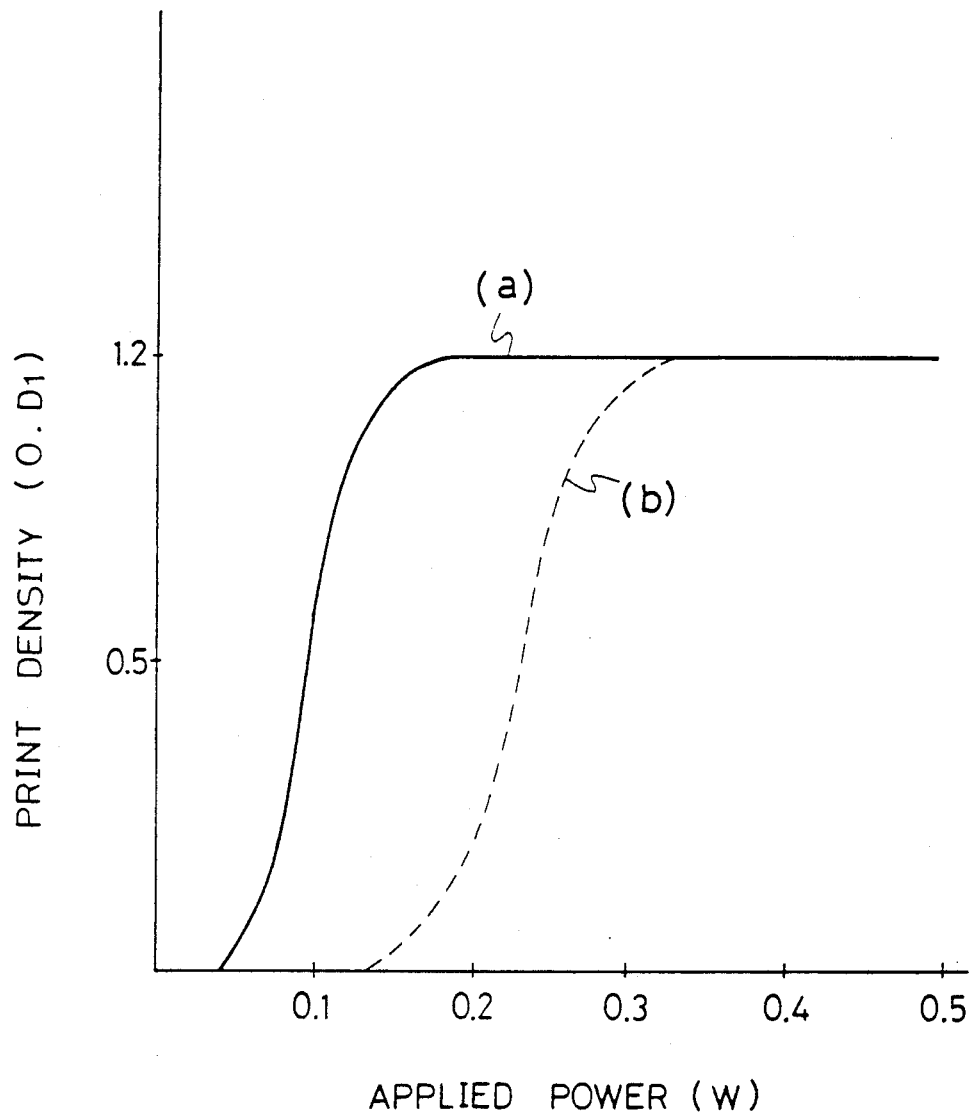

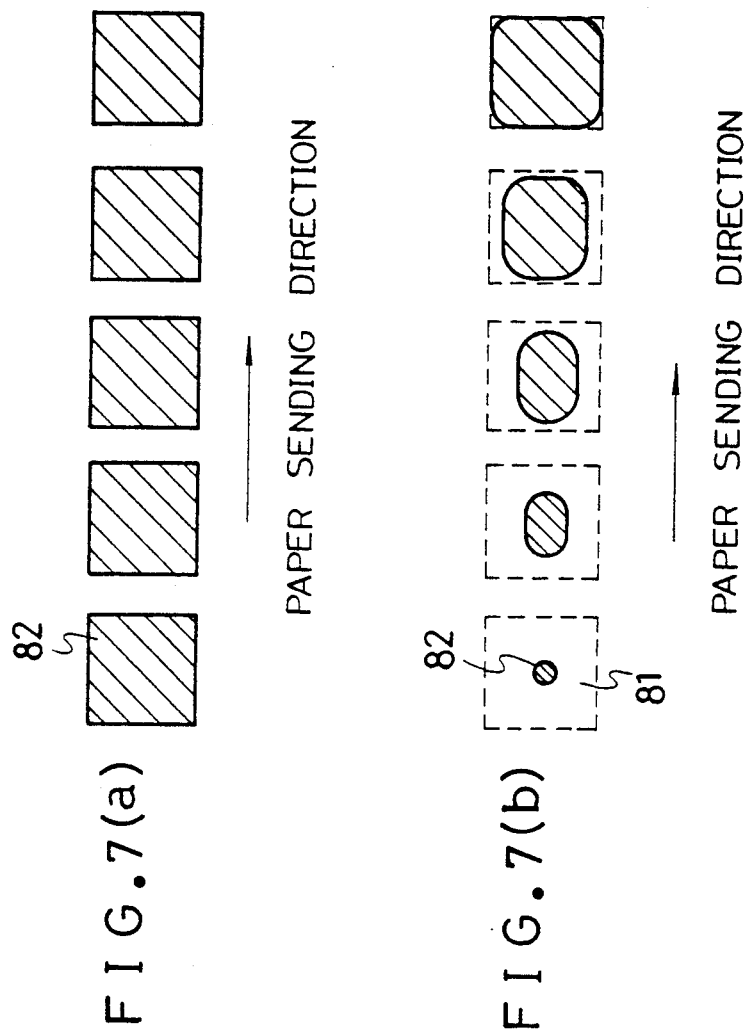

X-X' DIRECTION HEAT DISTRIBUTION CHARACTERISTIC

Y-Y' DIRECTION HEAT DISTRIBUTION CHARACTERISTIC

THERMAL HEAD FOR THERMAL RECORDING MACHINE

BACKGROUND OF THE INVENTION

1. Field of the Invention

The present invention relates to a thermal head for a thermal recording machine, employed for a facsimile device, a printer and the like.

2. Description of the Prior Art

In a prior art thermal head for a thermal recording machine, a thermal accumulating layer is formed on a substrate, and thereon a plurality of thermal resistors are disposed in array in a direction corresponding to the scanning, where discrete electrodes electrically connect one end of the thermal resistors to a control element and a common electrode electrically connects the other end of the thermal resistors together; and a protection film is provided to prevent the thermal resistors and the discrete and common electrodes from abrasion, deterioration, etc.

Japanese Unexamined Patent Publication Nos. 181657/1986 and 181658/1986 disclose thermal heads where a substrate made of heat resistant resin, such as a glass epoxy substrate, is used, while a thermal accumulation layer is formed of a polyimide resin or a melamine resin; Japanese Unexamined Patent Publication No. 12357/1986 discloses a thermal head where a heat insulating layer is formed of a heat resistant resin such as a polyimide resin on the substrate surface; Japanese Unexamined Patent Publication No. 117760/1987 discloses a thermal head where a ceramic substrate is overlaid with a heat-insulating layer of polyimide resin and an inorganic material layer; Japanese Unexamined Patent Publication No. 189253/1988 discloses a thermal head where a thermal resistor is formed through a layer of heat resistant resin on a metal substrate, while a layer of inorganic insulating material is provided between the thermal resistor and the layer of heat resistant resin; Japanese Unexamined Patent Publication No. 164555/1987 discloses a thermal head where a thermal accumulating layer of polyimide resin is provided on a common electrode; and Japanese Unexamined Patent Publication No. 56566/1989 discloses a thermal head where a good conductor of heat is provided on the bottom portion of a thermal resistor.

SUMMARY OF THE INVENTION

The present invention provides a thermal head for a thermal recording machine comprising an insulating substrate which is composed of a printed circuit board made of a heat resistant resin and covered with a copper film, a plurality of thermal resistors disposed on the insulating substrate in a direction corresponding to the scanning, discrete electrodes electrically connecting first ends of the thermal resistors to a control element, a common electrode electrically connecting the other ends of the thermal resistors together, a heat releasing layer formed on the copper film of the insulating substrate on the lower portions of the thermal resistors, and a thermal accumulating layer of a polyimide resin covering the heat releasing layer.

Preferably, an inorganic material layer having a thermal diffusivity larger than that the thermal resistors is interposed between the thermal resistors and the thermal accumulating layer.

The inorganic material layer may be formed of an $SiO_2$ film.

The copper film of the insulating substrate may be utilized as the discrete electrodes and the common electrode.

The present invention provides a thermal head comprising a heat resistant resin substrate, a thermal accumulating layer of a heat resistant resin formed on the surface of the substrate, a thermal resistor layer formed on the thermal accumulating layer, an electrode layer formed on the surface of the substrate for conducting electricity to the thermal resistor layer, a protective layer formed on the thermal resistor layer and the electrode layer, and a metal layer formed on at least a portion of the rear surface of the substrate for releasing heat.

The insulating substrate is preferably covered with a copper film on opposite sides thereof.

BRIEF DESCRIPTION OF THE DRAWINGS

FIGS. 1 through 8 relate to an embodiment according to the present invention;

FIG. 1 is a perspective view showing a major portion of a thermal head;

FIG. 2 is a sectional view of the thermal head;

FIG. 3 is a diagram for explaining a temperature distribution of a thermal resistor;

FIG. 4(c) is a diagram showing a heat response characteristic when a print board with a heat releasing layer alone is employed;

FIG. 5 is a diagram showing the relations between the applied power and print density in both this embodiment and a prior art embodiment;

FIGS. 7(a) and 7(b) are diagrams for explaining a print blur; and

FIG. 8 is a diagram for explaining a temperature distribution of the thermal resistor without an inorganic material layer.

FIG. 9 is a sectional view showing a major portion of the thermal head of the second embodiment;

FIG. 10 is a plan view of FIG. 9;

FIG. 11 is a perspective view showing a major portion of a variation of the embodiment;

FIGS. 12 and 13 are diagrams for explaining an overall structure of the thermal head;

FIG. 14 is a temperature hysteresis curve of a heat-generating portion of the thermal head; and FIG. 15 is a graph showing a temperature distribution of the heat-generating portion of the thermal head;

DESCRIPTION OF THE PREFERRED EMBODIMENTS

Now, the present invention will be described in detail in conjunction with four embodiments shown in the accompanying drawings.

Embodiment 1

Figure 1:
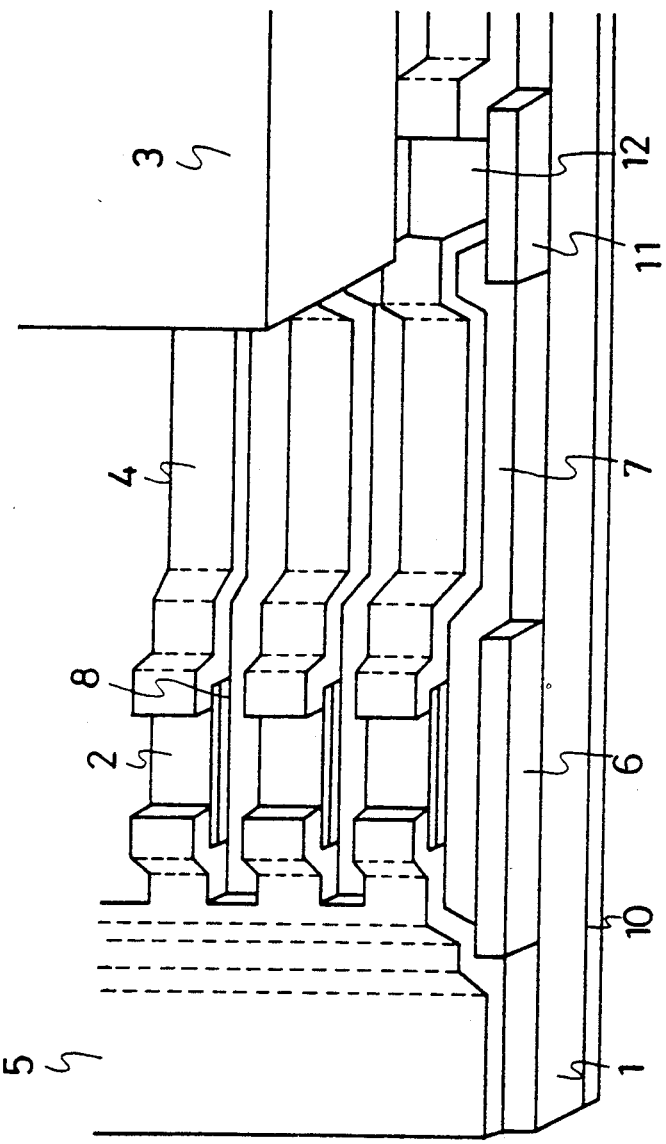
Figure 2:
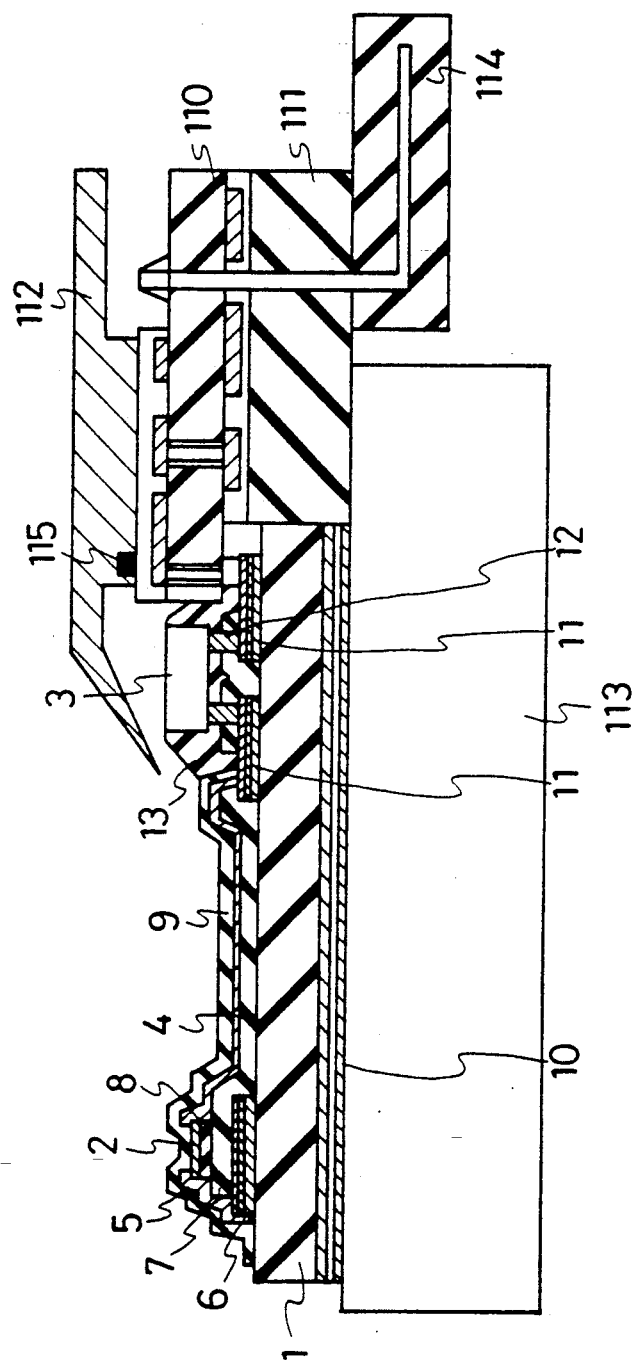

As shown in FIGS. 1 and 2, a thermal head of an embodiment (first embodiment) has a plurality of thermal resistors 2 disposed on an insulating substrate 1 in the direction corresponding to the scanning, discrete electrodes 4 electrically connecting first ends of the thermal resistors 2 to a control element 3, and a common electrode 5 electrically connecting second ends of the thermal resistors 2 together. The insulating substrate 1 is composed of a printed circuit board which is made of a heat resistant resin and filmed with copper, while the bottom portion of the thermal resistors 2 is overlaid with an inorganic material layer 8 of an insulating material having a thermal diffusivity larger than the thermal resistors 2, such as a $SiO_2$ film, a thermal accumulating layer 7 of polyimide resin and a heat-releasing layer 6 formed on a copper film of the insulating substrate, one after another.

As shown in the Thermal Diffusivity Table 1 below, the thermal accumulating layer 7 in this embodiment is made of polyimide resin having a thermal diffusivity about ¼ of a conventional thermal accumulating layer made by glass glazing, while the heat-releasing layer 6 is made of copper having a thermal diffusivity about 9 times as high as that of alumina ceramic and about 1000 times as high as that of polyimide resin. The insulating substrate 1 is composed of a print circuit board filmed with heat resistant copper having a low thermal diffusivity (in this embodiment, for example, a glass epoxy resin substrate having a thermal diffusivity about twice as much as that of polyimide and about ½ as much again as that of glass glaze), and the insulating substrate has the heat-releasing layer 6 on one side and a heat-releasing metal layer 10, which is made of copper, at a lower position on the other side.

In conjunction with FIG. 2, a detailed description will be further given. The insulating substrate 1 is a heat resistant print circuit board having a thermal decomposition starting temperature of 350° C., a thickness of 0.8 mm, a length of 232 mm and a width of 80 mm, and is a glass epoxy substrate formed of glass fiber impregnated with epoxy resin. Although the insulating substrate 1 can be produced at a lower cost than a conventional thermosensible recording machine of ceramic plate, problems occur in that it must not be heated at a temperature higher than the thermal decomposition point (350° C. in this embodiment) and it tends to warp or wave.

For the reasons mentioned above, the manufacturing process is performed under the condition that the insulating substrate 1 is maintained at a temperature lower than the thermal decomposition point, and the manufacturing of the thermosensible recording machine is performed under the condition that metal layers (the heat-releasing layer 6 and the backing metal layer 10) are fixed on both sides of the insulating substrate 1 to prevent the substrate from warping or waving.

After the insulating substrate 1 is filmed with copper (i.e., printed circuit board filmed with copper), it is subjected to electroless plating to make a three-layer structure including an Au layer deposited on the heat-releasing layer 6 and the backing metal layer 10 through an NiP layer (or an Ni layer). The reasons why the three-layer structure is preferable are: ①the copper film alone tends to be oxidized, and when oxidized, solder bumps cannot join to the substrate in forming bumps at a face down bonding portion mentioned below; ② when Au is directly deposited on the copper layer, diffusion is caused in both the copper and Au layers; and consequently, the copper in the surface of the Au layer is oxidized. The oxidation is prevented by creating a three-layer structure where a barrier (NiP) layer against the diffusion is provided between the copper layer and the Au layer.

The insulating substrate 1 having the metal layers on both sides is provided with the heat-releasing layer 6 and the face down bonding portion 11 patterned by etching the metal layer of the upper side. On the other hand, the metal layer of the lower side is used as the lower side metal layer 10 without being etched.

The thermal accumulating layer 7 is formed of polyimide resin, and simultaneously a solder dam 12 of a part the face down bonding portion 11 is formed. The thermal accumulating layer 7 is made of polyimide resin containing siloxane, having a thermal diffusivity of 0.11 ($mm^2$/sec).

The value is approximately ¼ of the thermal diffusivity 0.45 ($mm^2$/sec) of the glass glaze conventionally used. Thus, compared with the conventional embodiment, the heat lost on the side of the insulating substrate is reduced and the thermal energy conducted to thermosensible paper is increased; hence, energy can be effectively saved. The polyimide resin containing siloxane is superior in adhesion to metal.

On the polyimide thermal accumulating layer 7, a plurality of thermal resistors 2 are placed through the inorganic material layer 8 with an arrangement in the direction corresponding to the scanning. The inorganic material layer 8 is formed of an $SiO_2$ film thinner than the thermal accumulating layer 7. The $SiO_2$ is an insulating material and has a thermal diffusivity about 1.53 times as much as $TaSiO_2$; and therefore, it is useful to rapidly diffuse heat in a two-dimensional direction to unify the thermal distribution of the thermal resistors.

The thermal resistors 2 are formed of, for example, a $TaSiO_2$ film, having their respective first ends connected to the discrete wiring electrodes 4 which electrically connect them to the control element 3 and the other ends electrically connected together to the common wiring electrode 5, such that the thermal resistors 2 generate heat when selectively supplied with electric power through the control of the control element 3.

When the common wiring electrode 5 and the heat-releasing layer are electrically connected, the thermal efficiency is improved and sufficient current capacity to the current flowing in the common electrode can be obtained; hence, the thermosensible recording machine can be miniaturized.

A protection film 9 is formed on the thermal resistors 2, the common wiring electrode 5, the discrete electrodes 4 and the polyimide thermal accumulating layer 7 except for the solder dam portion 12 for face down bonding, and it serves as a moisture resistant antiabrasion film and an antiabration film.

The control element 3 is attached to the face down bonding portion 11 and is covered with epoxy resin 13.

A heat sink 113 is bonded through the backing metal layer 10 to the bottom face of the insulating substrate 1. The heat sink 113 is formed of a metal having a high thermal diffusivity (e.g., an aluminum plate in this embodiment) to diffuse the heat of the thermosensible recording machine.

Now, the thermal characteristics of the heat-releasing layer 6, the thermal accumulating layer 7 and the insulating substrate 1 will be explained in more detail with reference to Table 1.

Table 1 shows the thermal diffusivities of the materials of which the thermosensible recording machine is formed.

TABLE 1

| Material | Thermal Diffusivity (mm$^2$/sec) | Ratio |
|---|---|---|
| Heat Resistance Epoxy | 0.25 | 0.43 |
| Copper | 112.8 | 194.5 |
| Polyimide Resin | 0.11 | 0.19 |
| SiO$_2$ | 0.89 | 1.53 |
| TaSiO$_2$ | 0.58 | 1.00 |
| Al | 86.5 | 149.1 |
| Sialon | 9.96 | 17.2 |
| Alumina Ceramic | 12.1 | 20.9 |
| Glazed Glass | 0.45 | 0.77 |

Notes: The ratios are presented with the reference value 1 of TaSiO$_2$.
Thermal Diffusivity a = K/$\rho$c
k = Thermal Conductivity (cal/mm · sec °C.)
$\rho$ = Density (g/mm$^3$)
c = Specific Heat (cal/g · °C.)

The Joule heat generated in the thermal resistors 2 is diffused upwards and downwards with regard to the section of the thermosensible recording device except for the loss of the heat released through the discrete electrodes 4 and the common electrode 5. Now assuming that the energy propagated through the protection film 9 to the thermosensible paper is $Q_1$, the energy propagated to the heat releasing layer 6 and further to the insulating substrate 1 through heat accumulating layer 7 is $Q_2$, and the energy propagated through the heat accumulating layer 7 to the insulating substrate 1 is $Q_3$, the following conditions are satisfied upon ON and OFF times of the applied voltage:

(1) when the applied voltage is turned ON, $Q_1 > Q_2 > Q_3$ (2) when the applied voltage is turned OFF, $Q_2 > Q_1, Q_2 > Q_3$ As can be seen, when the applied voltage is turned ON, the protection film 9 of sialon is 9.96 (mm$^2$/sec) in thermal diffusivity, while the polyimide thermal accumulating layer 7 is 0.11 (mm$^2$/sec) in thermal diffusivity, where the thickness of the sialon film is 3 μm while the thickness of the thermal accumulating layer 7 is 6–10 μm. Thus, the isothermal line drawn with the origin of the center line of the thermal resistor 2 is more dense on the area closer to the protection film such that the relationship of $Q_1 > Q_2 + Q_3$ is always satisfied. Similarly, under the conditions that the heat releasing layer 6 of copper is 9 μm in thickness and 12.8 (mm$^2$/sec) in thermal diffusivity while the heat resistant glass epoxy substrate (insulating substrate 1) is 0.8 mm in thickness and 0.25 (mm$^2$/sec) in thermal diffusivity, the relationship $Q_2 > Q_3$ is satisfied.

When the applied voltage is turned OFF, the heat accumulated in the polyimide thermal accumulating layer 7 of low thermal diffusivity is released; and hence TaSiO$_2$ (the thermal resistor 2) and copper (the heat releasing layer 6) disposed on the opposite sides of the thermal accumulating layer 7 are, respectively, 0.58 (mm$^2$/sec) and 112.8 (mm$^2$/sec) in thermal diffusivity.

Because of the heat releasing layer 6 of copper of which ratio is 194.5 times as much as that of the thermal resistor 2 of TaSiO$_2$, the energy $Q_2$ is larger than the energies $Q_1$ and $Q_3$; and consequently, the energy transmitted towards the thermosensible paper is switched between $Q_1 > Q_2$ (when the applied voltage is ON) and $Q_1 < Q_2$ (when the applied voltage is OFF), and thus, the energy can be quickly switched.

The above situation is attained without exerting any effect on the formation of the inorganic material layer 8. The heat conducted to the layers at lower levels than the TaSiO$_2$ layer (the thermal resistor 2) is blocked by the polyimide thermal accumulating layer 7 of low thermal diffusivity, and therefore, the quantities of heat of $Q_1$ and $Q_2$ are independent of the existence of the inorganic material layer 8. The heat conducted to the layers at higher levels is diffused in TaSiO$_2$ (the thermal resistor 2) by the inorganic material layer 8; however, the total quantity of the heat conducted to the thermosensible paper is not changed. Thus, $Q_1 > Q_2 > Q_3$ at ON-time and $Q_2 > Q_1$, $Q_2 > Q_3$ at OFF-time are always satisfied.

With regard to the aspect as previously mentioned, in the conventional thermosensible recording device employing a glazed ceramic substrate, the protection film of sialon is 9.96 (mm$^2$/sec) in thermal diffusivity, the alumina ceramic substrate is 12.1 (mm$^2$/sec) and the glass glaze is 0.45 (mm$^2$/sec), which are close to one another compared the components in the embodiment according to the present invention; although the conditions as in the above, $Q_1 > Q_2$ (when the applied voltage is ON) and $Q_1 < Q_2$ (when the applied voltage is OFF), are satisfied, the difference between $Q_1$ and $Q_2$ either at ON- or OFF-time of the applied voltage is not so large that the print efficiency is not good. However, in accordance with the present invention, since polyimide resin of sufficiently low thermal diffusivity and copper of sufficiently high thermal diffusivity are used, the difference between $Q_1$ and $Q_2$ becomes large, and the thermal efficiency can be significantly improved.

The electrical and thermal capacities of the heat releasing layer 6 can be increased by electrically connecting the heat releasing layer 6 to the common wiring electrode 5, and therefore, the difference between $Q_1$ and $Q_2$ is further increased, and the thermal characteristic can be improved. Moreover, sufficient current capacity to the current can be obtained, so that the miniaturization of the thermal recording machine can be effectively attained.

The insulating substrate 1 is formed of heat resistant glass epoxy material having a thermal diffusivity about twice as much as the polyimide thermal accumulating layer 7 and about 1/50 as much again as the conventional alumina ceramic substrate; and consequently, most of the heat accumulated by the polyimide thermal accumulating layer 7 is released through the copper heat releasing layer 6 to the insulating substrate 1. At this time, the thermal diffusivity of the insulating substrate 1 is low to some extent, and therefore, the insulating substrate itself functions to somewhat accumulate the heat to be helpful in the energy-saving-oriented operation.

The backing metal layer 10 functions as mentioned below: The heat from the thermal resistors 2 are rapidly diffused through the insulating substrate 1 to the backing metal layer 10 and then to the heat sink 113 bonded to the bottom surface of the backing metal layer 10 when a drive pulse is OFF; and in this way, the capability of releasing heat is further enhanced.

Figure 4A:
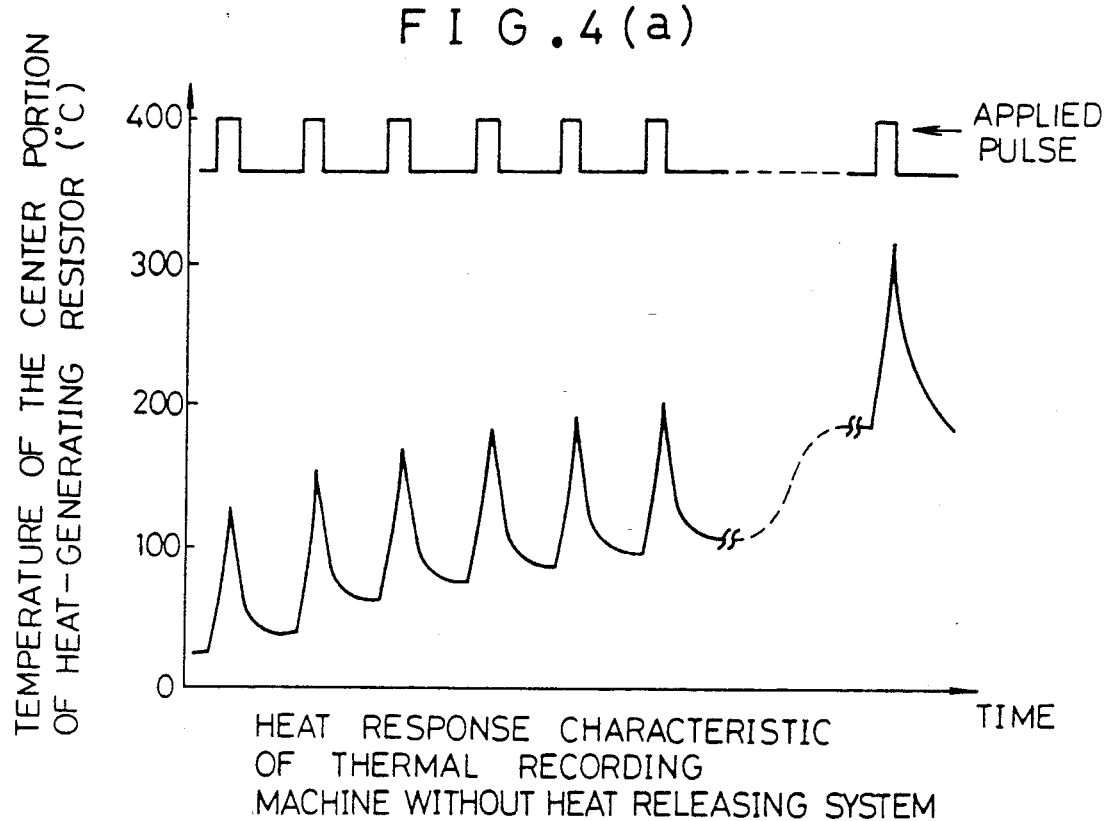
FIG. 4(a) is a diagram showing a heat response characteristic when a print board without a heat releasing system is employed.
Figure 4B:
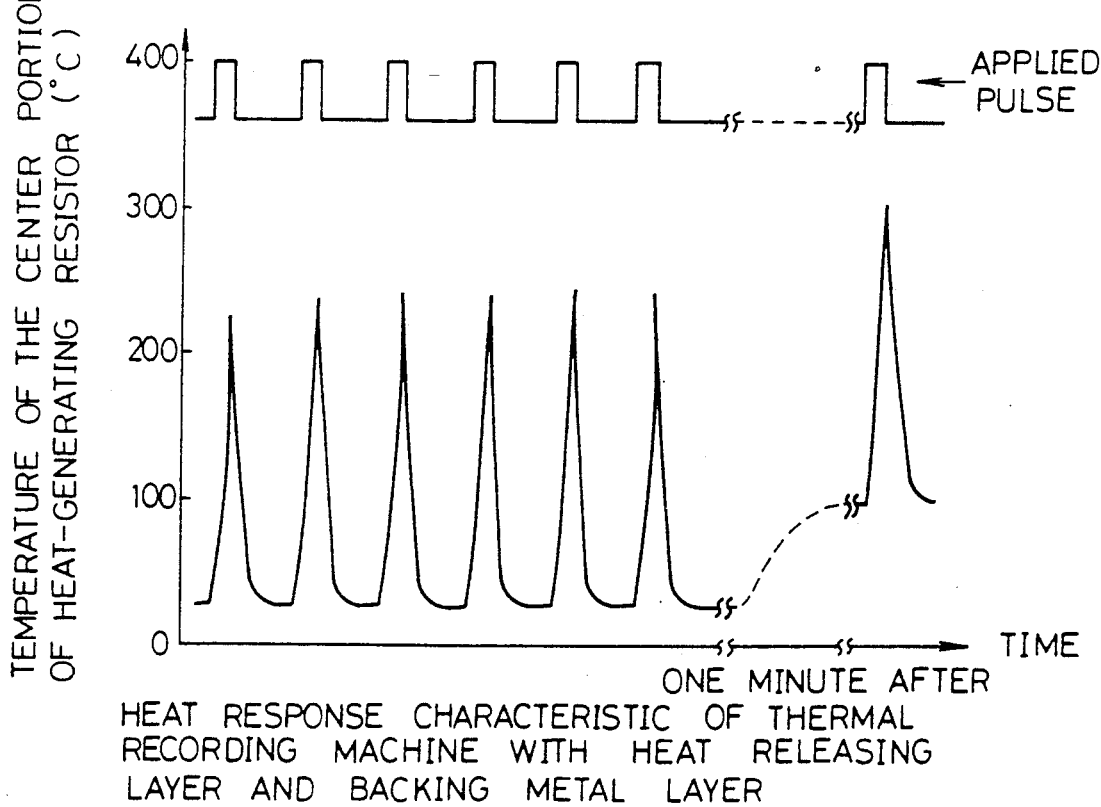
FIG. 4(b) is a diagram showing a heat response characteristic when a print board with a heat releasing layer and a backing electrode layer is employed.

FIG. 4 shows the temperature variation of the surface of the substrate with time when a sequential pulse is applied. Without the heat releasing layer 6 and the backing metal layer 10, as shown in FIG. 4(a), the Joule heat generated by the thermal resistors is continuously accumulated by the substrate as the number of applied pulses increases; and thereafter, the tailing phenomenon occurs when the heat is accumulated up to the quantity beyond the temperature at which color development begins in the thermosensible paper. On the contrary, as shown in FIG. 4(b), with the heat releasing layer 6 and the backing metal layer 10, it is arranged that the heat is released in an appropriate part so that the thermal accumulation in the head is prevented to improve the thermal characteristic. When the heat releasing layer 6 alone is provided but the backing metal layer 10 is not, the difference in time, when the temperature rises, and the temperature rising of the thermal resistors (at OFF-time of the applied voltage) can be observed as shown in FIG. 4(c), but the temperature rising is significantly inhibited compared with the embodiment having a heat releasing system (see FIG. 4(a)). As a result, the thermal characteristic can be improved to some extent.

Now, the energy consumption in the thermal recording machines of this and prior art embodiments will be explained.

FIG. 5, (a) and (b) show characteristic relations between the applied power and print density in this and prior art embodiments. As can be seen, the applied power required for the identical print density is much smaller in this embodiment shown in (a) than in the prior art embodiment shown in (b). This is because the thermal accumulating layer 7 is made of polyimide resin of sufficiently low thermal diffusivity. The heat is blocked by the thermal accumulating layer 7 while the power is being applied, and hence the loss of the generated heat is reduced compared with the prior art embodiment. Thus, with less energy, the printing at the same level as the conventional printing can be assured. Since the insulating substrate 1 is formed of heat resistant glass epoxy material of low thermal diffusivity, the heat is also retained by the insulating substrate 1; and consequently, with energy less than that which is required in the prior art embodiment, the thermal head can be driven.

The inorganic material layer 8 will be described in detail. The inorganic material layer 8 formed of an insulating material of a thermal diffusivity larger than that of the thermal resistor 2 (e.g., an $SiO_2$ film having a thermal diffusivity about 1.53 times as much as that of $TaSiO_2$) is provided at the lower portion of the thermal resistor 2. The heat concentrated at the center portion of the thermal resistor 2 is diffused all over the thermal resistor 2 through the inorganic material layer 8 of thermal diffusivity larger than that of the thermal resistor 2. Additionally, since the inorganic material layer 8 is formed of insulating material, the temperature distribution of the thermal resistor 2 can be unified without exerting any effect on the electrical characteristic of the thermal resistor 2.

Insulation materials other than $SiO_2$, such as sialon, SiN, $Al_2O_3$ and the like, can be used. Sialon is 9.96 (mm$^2$/sec) in thermal diffusivity, $Al_2O_3$ is 12.1 (mm$^2$/sec) in thermal diffusivity, and SiN is equivalent or beyond in thermal diffusivity compared with sialon. The $SiO_2$ film is useful because it is advantageous in that it can be easily processed, it is cheap (target and the like), it has a good adhesion to polyimide resin of the thermal accumulating layer, etc.

With reference to FIGS. 3, 7 and 8, the above-mentioned thermal diffusion will be explained in the comparison of the thermal head having the inorganic material layer 8 with the thermal head and without the thermal head.

FIGS. 7(a) and 7(b) show the states of printing where the printing is blurred and not blurred. As shown in FIG. 7(b), a print blur 81 is a phenomenon that is caused because the dots printed are not developed in color over all dimensions of the dots printed by the thermal resistors but partly developed. When a developed portion 82 is smaller than the print dot dimensions, it seems that the print density is thin.

FIG. 8 shows the case without the inorganic material layer 8; (a) is a plan view of the thermal resistor 2, while (b) and (c) are temperature distribution diagrams in the X—X' and Y—Y' directions of the diagram (a). The temperature is measured by an infrared temperature radiator.

Figures 8A, 8B, 8C:
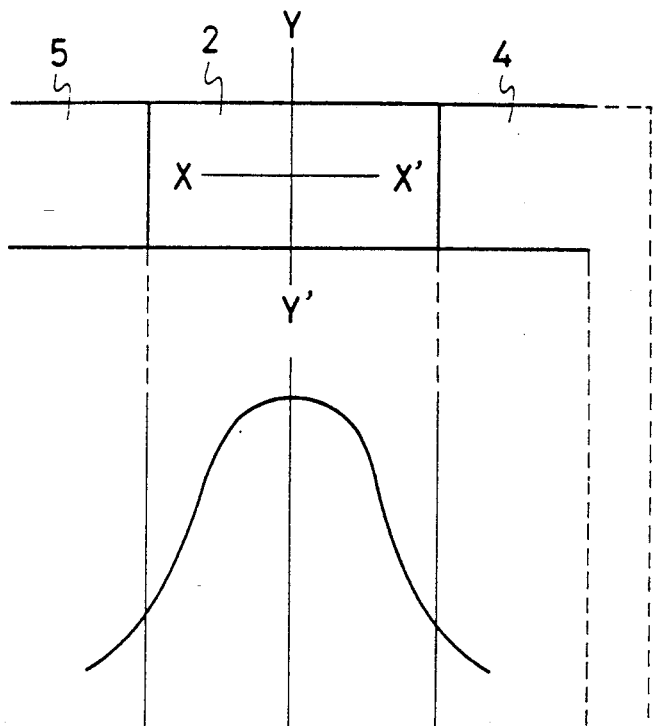

As shown in FIGS. 8(b) and 8(c), since the current density is concentrated at the center portion of the thermal resistor 2, the quantity of the generated heat at the center portion is increased. Additionally, because of the negative characteristic of the resistance temperature coefficient of $TaSiO_2$ used as the material of the thermal resistor 2, the current is further concentrated at the center portion of the thermal resistors; and as a result, the printing is blurred as explained in conjunction with FIG. 7(b).

Such a phenomenon does not arise in the conventional thermosensible recording machine employing a glazed ceramic substrate; and is instead caused because the polyimide thermal accumulating layer 7 placed in the lower portion of the thermal resistor 2 is very low in thermal diffusivity, so that the quantity of the heat diffused over all the thermal resistor 2 is very small.

The printing is blurred only at the beginning of the printing. After a certain period of time of printing, no blur is observed because the temperature of the insulating substrate 1 and the like rises.

Figure 3A:
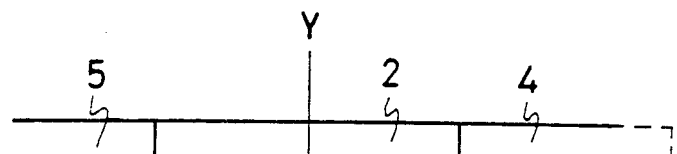

FIG. 3 shows the case where the inorganic material layer 8 is provided. Similar to FIG. 8, (a) is a plan view of the thermal resistor 2, while (b) and (c) are temperature distribution diagrams in the X—X' and Y—Y' directions of FIG. 3(a). The temperature is also measured by an infrared temperature radiator.

Figure 3B:
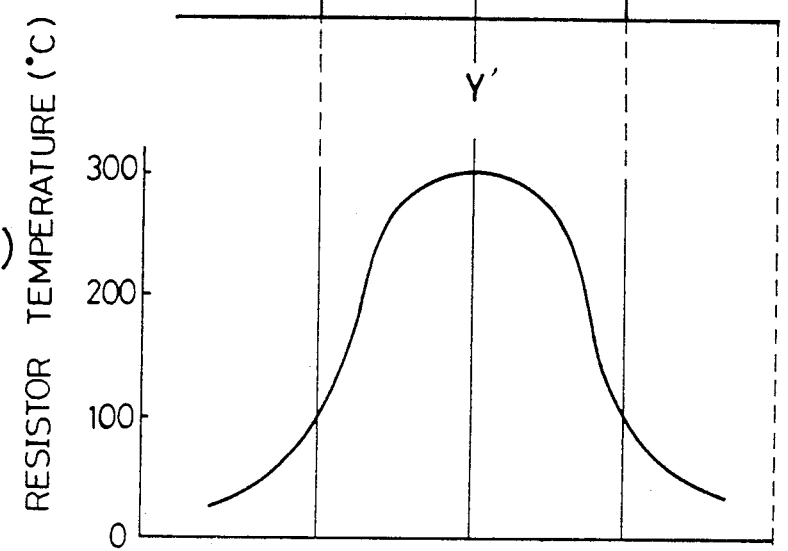
Figure 3C:
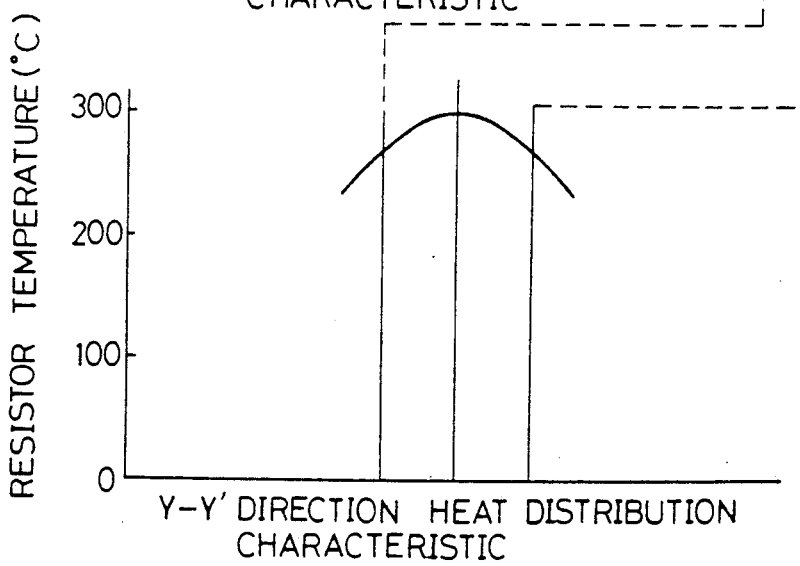

As shown in FIG. 3(b), the temperature distribution of the thermal resistor 2 in the X—X' direction is almost the same as in the case where the inorganic material layer 8 does not exist (this is because aluminum wiring electrodes having a large thermal diffusivity are formed at the opposite ends of the thermal resistor); However, as clearly shown in FIG. 3(c), the temperature distribution in the Y—Y' direction is rapidly unified by providing the inorganic material layer 8, and thus the print blur can be prevented.

A method of manufacturing the thermal head of this embodiment will be described with reference to FIG. 6.

The heat resistant printed circuit board 1, which is formed of glass fiber impregnated with heat resistant epoxy resin and of which a thermal decomposition starting temperature is 350° C., is filmed with metal by the heating press technique. The insulating substrate 1 is overlaid with the metal film, which is composed of an aluminum film 14 of thickness 40 μm and a copper film 6A of thickness 5–12 μm, or desirably 9 μm, formed on the aluminum film 14, with the aluminum film 14 externally exposed. The aluminum film 14 is used as a carrier material which serves as a base of the thin copper film 6A, and the aluminum film 14 is etched away after the printed circuit board 1 is filmed with the metal film.

The surface of the copper layer 6A on the insulating substrate 1 formed in this way (printed circuit board filmed with copper) is conditioned by abrasive material of nonwoven fabric to remove the remaining aluminum, and an oxidation film on the copper film 6A.

After that, the insulating substrate 1 is put in an oven heated at 300° C. to stabilize its dimensions, and the surface of the copper layer 6A is further conditioned to remove an oxidation film on the copper film 6A.

Figure 6A:
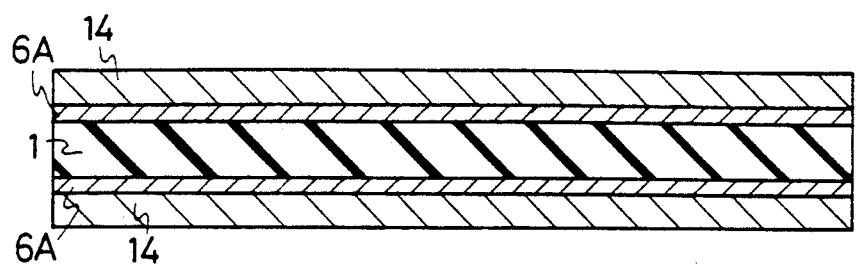
FIG. 6(a) through FIG. 6(i) are diagrams showing the steps of manufacturing the thermal head of the present invention.
Figure 6B:
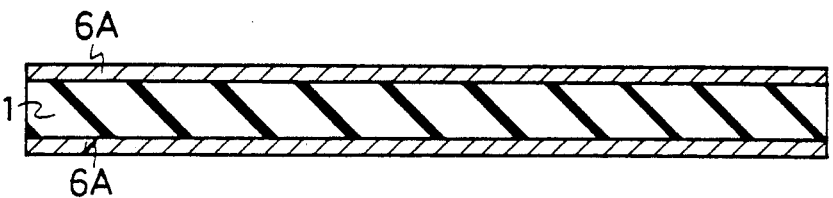

In this way, the insulating substrate 1 shown in FIG. 6(b) is obtained.

Figure 6C:
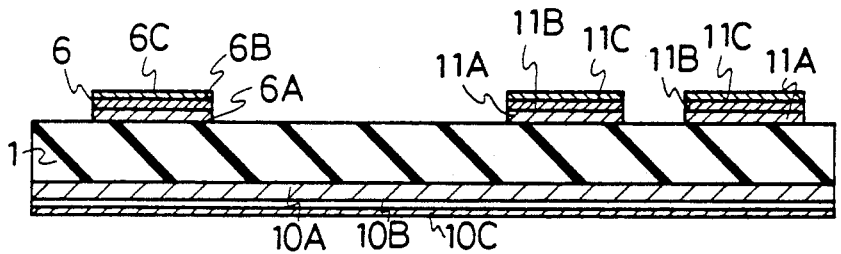

Then, as shown in FIG. 6(c), in order to pattern the copper layer 6A on the surface of the insulating substrate 1, the steps of forming resist by the electro-deposition technique, etching the copper and peeling off the resist are performed successively. The heat releasing copper layer 6A and the face down bonding copper layer 11A are simultaneously formed by the patterning process; however, the copper layer on the rear surface of the insulating substrate 1 is left in its entirety without being patterned for the purposes of improving the thermal characteristic of the substrate and preventing the substrate from warping because of the heat.

The heat releasing copper layer 6A, face down bonding copper layer 11A and backing copper layer 10A which are patterned are overlaid with NiP layers (6B, 11B, 10B) and Au layers (6C, 11C, 10C) one after another by the electroless plating. This is for preventing the oxidation of the surface of the copper in the manufacturing process. When Au is directly deposited on the copper, both of the metals are diffused into each other, and the copper is oxidized on the surface of the Au. A three-layer structure where an NiP layer of thickness 1–2 μm is formed as a barrier for preventing the diffusion between the copper and Au layers is designed to prevent the diffusion and oxidation.

Figure 6D:
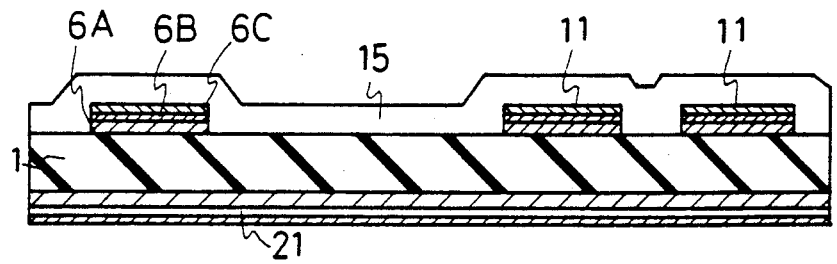
Figure 6E:
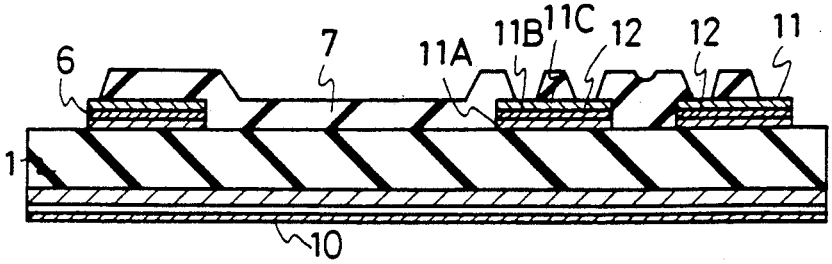

After that, as shown in FIG. 6(d), the entire surface of the the insulating substrate 1 of polyimide resin is coated with polyimide precursor 15 by the rolling coating technique or the spinning coating technique. Then, as shown in FIG. 6(e), the polyimide resin is patterned into a specified form, partly leaving the polyimide resin on the upper surface of the face down bonding metal layers (11A, 11B, 11C) and the common electrode metal layers (6A, 6B and 6C which are referred to as "heat releasing layer 6" en block hereinafter) except target areas for electrodes of solder dam 12 in the face down bonding portion; and thereafter, a heat treatment hardens the polyimide precursor into imide. In this way, the polyimide thermal accumulating layer 7 and the solder dam 12 in the face down bonding portion are formed. The way of patterning the polyimide precursor 15 includes a positive resist method and a negative resist method; the former is characterized in that the development of the resist and the etching of the polyimide can be simultaneously performed, but the accuracy in patterning is reduced.

The way of forming the polyimide thermal accumulating layer 5 in the positive resist method will be described. In the positive resist method, after being coated with the polyimide precursor 15, the insulating substrate 1 is put in an oven heated 100°–150° C. and hardened into a tack free condition; and thereafter, the steps of forming the resist, exposing it to light, developing it and peeling it off are performed successively. The developer used in the developing step is a 5% solution of tetra-methyl-hydroxide. In the solution, the development and etching can be simultaneously performed, and the number of required steps can be reduced. After the photoetching, the polyimide precursor 15 is heated and hardened into imide. To avoid cracking, the insulating substrate 1 is subjected to a heat treatment in an oven heated at 300° C., and then cooled down with its rear side in contact with a heat releasing plate while the polyimide precursor 15 on the front side is heated with a temperature over 300° C. by infrared irradiation to form the polyimide thermal accumulating layer. The infrared irradiation is performed because the insulating substrate 1 is under 350° C. in thermal decomposition temperature, while the polyimide resin is 300° C. in hardening temperature; the temperatures are close to each other, and therefore the insulating substrate 1 should not directly be heated in an oven.

The other way of forming the polyimide thermal accumulating layer 7 by the negative resist method will be described.

After being coated with the polyimide precursor 15, the insulating substrate 1 is heated in an oven in stages, first at 150° C., then at 200° C. and so forth, so that the polyimide precursor 15 is in a tack free state. In the tack free state, the polyimide precursor 15 is further developed into imide than the tack free state in the positive resist method; and hence, the accuracy in etching is improved. After that, the steps of forming the resist, exposing it to light, developing it and etching the polyimide are successively performed.

The etchant used at this time is a mixture of hydrazine with ethylene diamine. The insulating layer 1 is subjected to a heat treatment in an oven heated at 300° C. after the photoetching, and then, similar to the positive resist method, the insulating substrate 1 is cooled down with the rear side in contact with a heat releasing plate while the polyimide precursor 15 on the front side is heated to over 300° C. by the infrared irradiation to form the polyimide thermal accumulating layer 7. The polyimide thermal accumulating layer 7 is formed of non-photosensitive polyimide resin containing siloxane for adhesion of the resin to the metal.

Figure 6F:
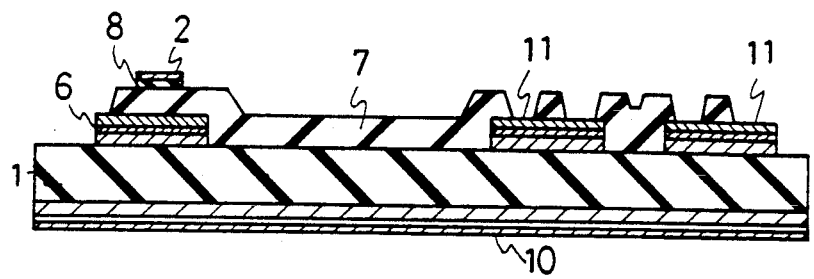

Then, as shown in FIG. 6(f), the inorganic material layer 8 is formed on the polyimide thermal accumulating layer 7. Herein, the specific pattern is finished by performing a photoetching after an SiO₂ layer is formed by spattering.

Furthermore, after a thermal resistor layer is formed by spattering, the thermal resistor layer is pattern-etched so that a plurality of thermal resistors 2 are disposed in array in the direction corresponding to the scanning.

Figure 6G:
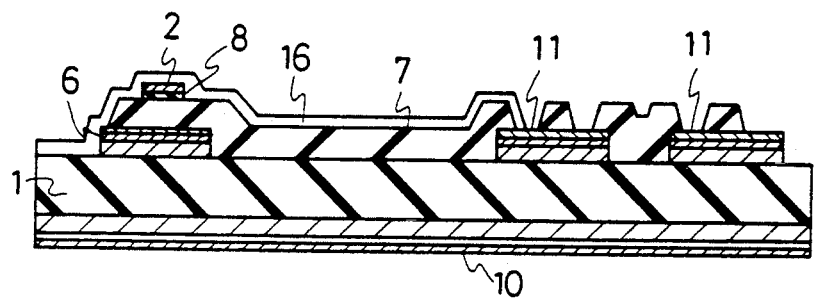
Figure 6H:
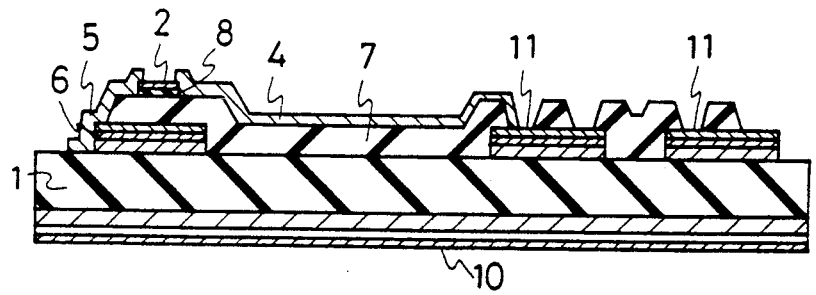

Then, as shown in FIG. 6(g), after a wiring electrode layer 16 is formed by spattering, the discrete electrodes 4 for electrically connecting the thermal resistors 2 to the control element 3 and the common wiring electrode 5 for electrically connecting the thermal resistors 2 are formed by etching. The resistance material used herein is TaSiO₂; the wiring electrode material is Al-Si.

Figure 6I:
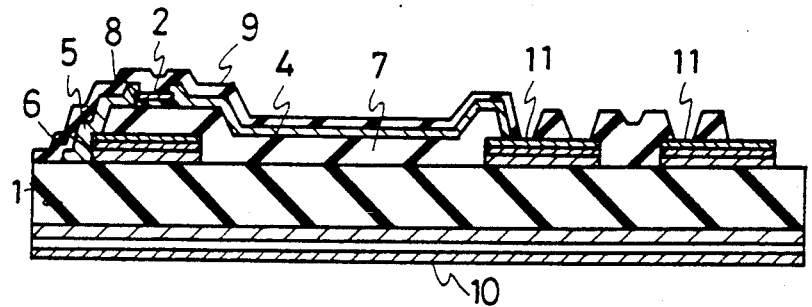

Eventually, as shown in FIG. 6(i), the protection film 9 is formed by depositing SiON by plasma CVD. (The protection film 9 may be formed by depositing sialon by spattering.)

In the above manufacturing methods, a unitary substrate is formed and divided into pieces to simultaneously form a plurality of discrete substrates, allowing for the productivity. After being divided in predetermined dimensions by dicing, each of the divided substrates is connected to the face down bonding portion 11 through the control element 3 subjected to reflowing in an infrared furnace by the face down bonding method. The control element 3 is covered with the epoxy resin 13, and a dual-face flexible circuit board 110 to which a thermistor, a connector, a capacitor, etc. are soldered is interposed between a head cover 112 and the heat sink 113 and fixed with small screws, so that the flexible circuit board 110 for inputting/outputting signals can be connected to the thermal head portion.

The thermal head of this embodiment is finished through the steps as mentioned above.

The thermal accumulating layer 7 employed in this embodiment is made of non-photosensitive polyimide resin containing siloxane; however, the material of the thermal accumulating layer 7 is not limited to it, but other kinds of non-photosensitive polyimide resin or photosensitive polyimide resin may be used.

As has been described, in accordance with the present invention implemented in this embodiment, an insulating substrate is formed of heat resistant resin of low thermal diffusivity, so that the thermosensible recording machine can be manufactured at low cost. Additionally, since a polyimide thermal accumulating layer and a heat releasing layer formed of a copper film on the insulating substrate, both of which are of sufficiently low thermal diffusivities, are provided under thermal resistors, the consumed electric power can be saved, and a rapid printing can be implemented. With an inorganic material layer, which is made of a material of a thermal diffusivity higher than that of the material of the thermal resistors, under the thermal resistors, a print blur at the beginning of the printing can be prevented, and thus, a thermosensible recording machine whereby a high quality of printing can be expected is provided.

Embodiment 2

Figure 9:
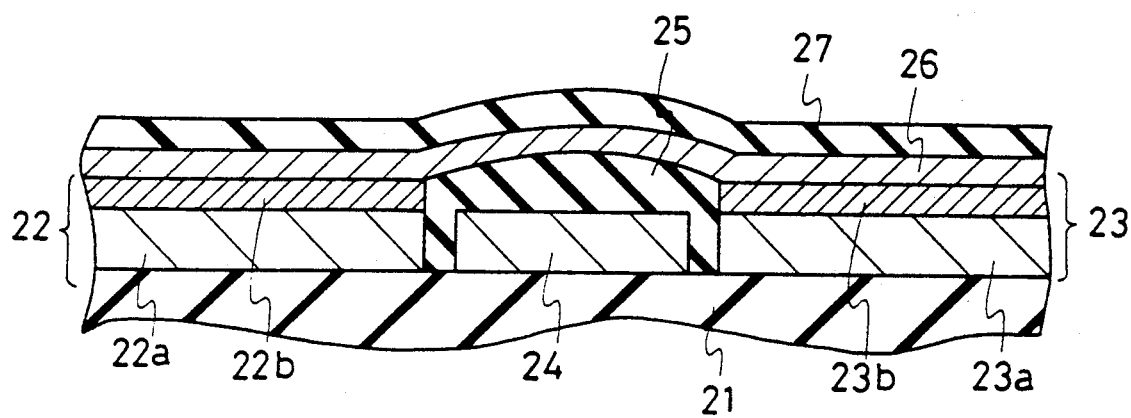
FIGS. 9 through 15 relate to another embodiment according to the present invention.

FIG. 9 is a sectional view showing a major portion of another embodiment according to the present invention. In FIG. 9, a heat resistant insulating substrate 21 is provided with metal layers, or a common electrode portion 22a and a wiring electrode portion 23a of, for example, copper film. Between the common electrode portion 22a and wiring electrode portion 23a, a metal layer 24 is provided insulated from them. The state is shown in a plan view of FIG. 10.

The way of fabricating the thermal head of this embodiment is as follows. The heat resistant insulating substrate is provided with the metal layers (of copper film, for example) in advance. The metal layers are etched by the photoetching technique to form the common electrode portion 22a, the wiring electrode portion 23a and the metal layer 24 insulated from them.

Then, before a thermal accumulating layer 25 is formed on the metal layer 24, conductor layers 22b, 23b are formed on the common electrode portion 22a and the wiring electrode portion 23a by vapor deposition, spattering or the like so that the levels of the common electrode portion 22a and wiring electrode portion 23a are somewhat higher than the level of the metal layer 24. The level difference is made, when the thermal accumulating layer is formed on the metal layer 24, to maintain the thickness of the thermal accumulating layer. Instead of making the conductive layers 22b, 23b, the metal layer 24 may be etched to keep the level lower than the electrode portions 22a, 23a.

Then, a heat resistant resin, such as polyimide and the like, is put on the metal layer 24 between the common electrode 22a and wiring electrode 23 thus formed and hardened.

Next, a thermal resistor 26 is formed on the hardened resin, being in electrical contact with with the common electrode 22a and the wiring electrode 23a; and the thermal resistor 26 is covered with an antiabrasion protection layer 27. In this way, a heat generating assembly is obtained.

Figure 10:
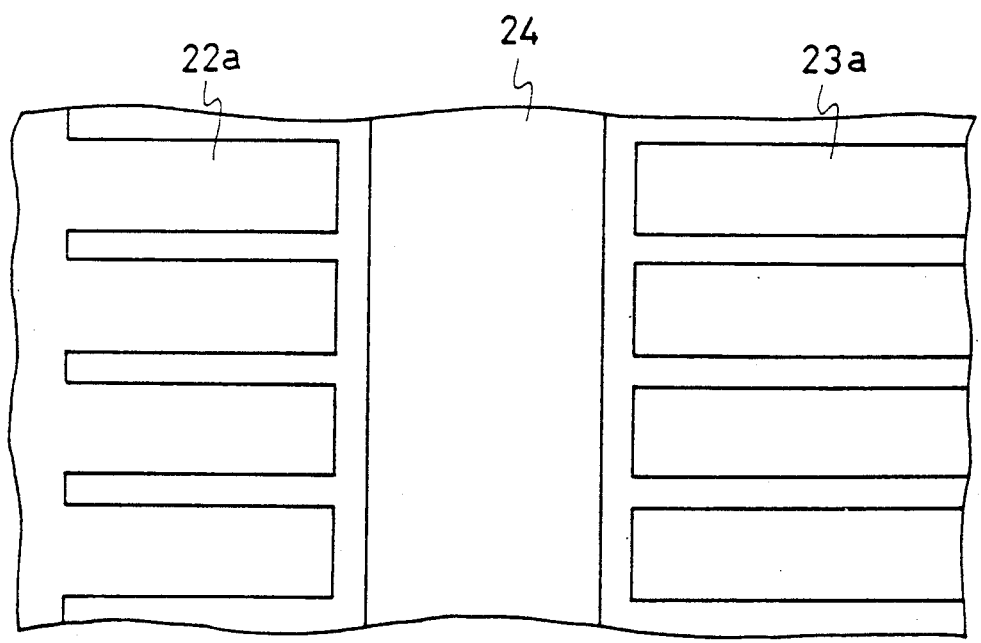

The metal layer 24 interposed between the common electrode 22a and the wiring electrode 23a is desirably formed, extending unceasingly in the direction corresponding to the main scanning as shown in FIG. 10. The metal layer 24 lying under the thermal accumulating layer 25 functions to release the heat accumulated in the thermal accumulating layer 25 to some extent. If the metal layer 24 is separated in the direction corresponding to the main scanning as in the heat generating assembly, the thermal capacity of the metal layer becomes extremely small, compared with the the metal layer 24 unceasing in the direction corresponding to the main scanning; and as a result, even if the temperature distribution on the resistor can be unified, it is likely that an improvement of the thermal conductivity in each of the resin substrate 21 and thermal accumulating layer 25 does not bring about the effect that the temperature rising caused by applied pulses is inhibited, as well as it is expected. Thus, it is desirable to form the metal layer 24 unceasing in the direction corresponding to the main scanning as shown in FIG. 10.

Figure 11:
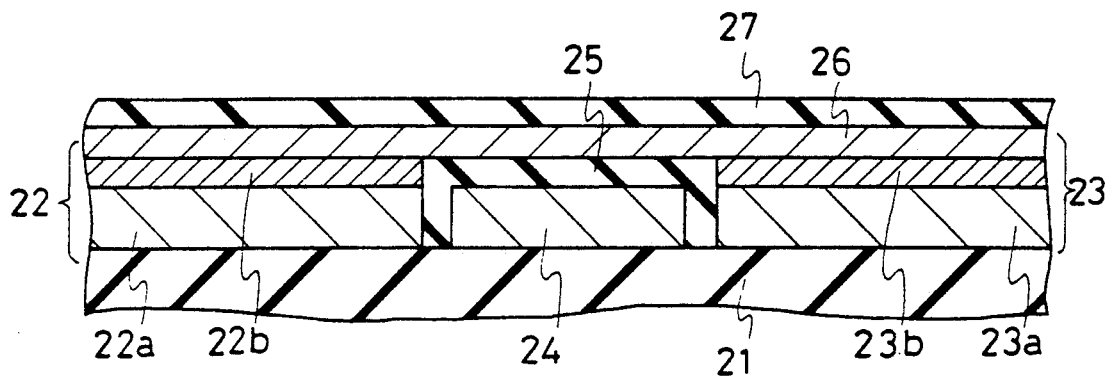
Figure 14:
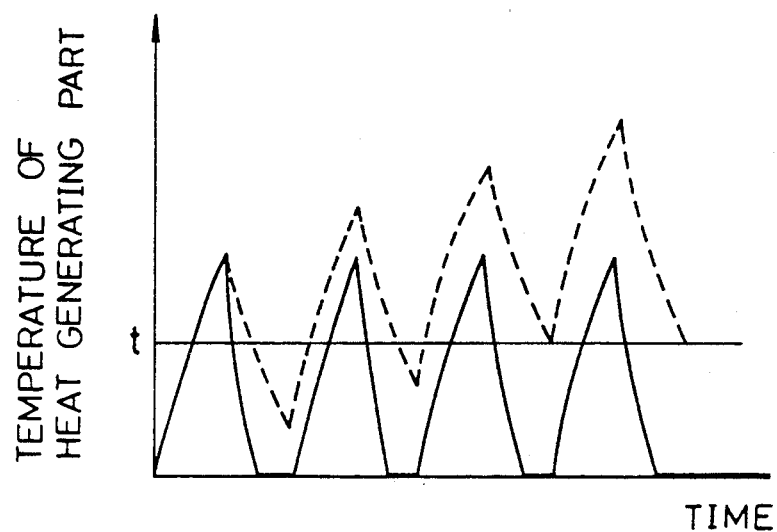
Figure 15:
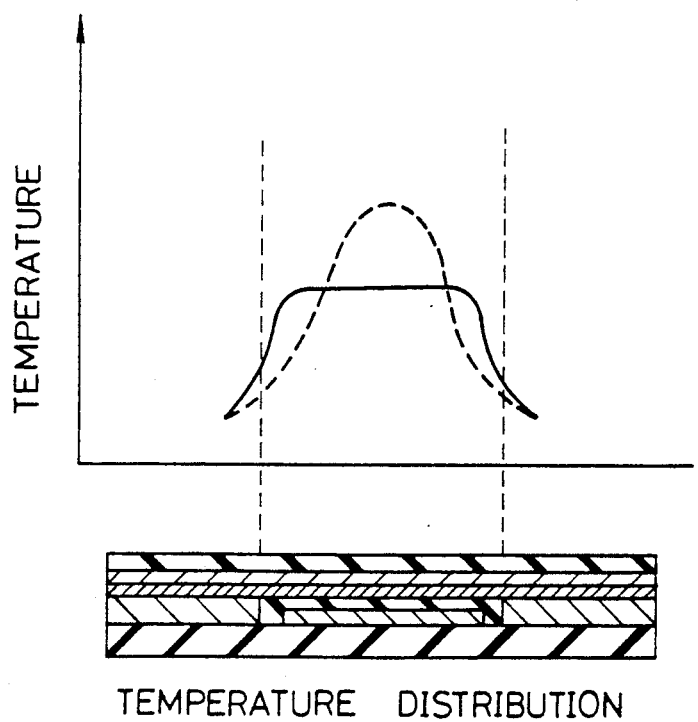

FIG. 11 is a sectional view showing a major portion of the modified thermal head of this embodiment, where the center portion of the heat generating assembly is flat, and other parts are identical with corresponding parts in FIG. 9. The primary difference of the embodiment in FIG. 11 from the embodiment in FIG. 9 is in the thickness of the thermal accumulating layer, and a contact with paper can be controlled by altering the extent of the rising at the center of the heat generating assembly. The metal layer 24 can be changed by etching with diverse thickness, while the thermal accumulating layer 25 can be changed by controlling the amount of the heat resistant resin. For example, a thermal head of an energy-saving type can be implemented by increasing the thickness of the thermal accumulating layer 25, while a thermal head of a high-speed type can be implemented by reducing the thickness. Thus, various types of thermal heads can be designed for various uses without a complex manufacturing process. In the aspects of the above-mentioned embodiments, the temperature hysteresis curve is shown by the solid line in FIG. 14, which shows that the temperature drop from the peak is quicker than in the prior art embodiment without a metal layer under a thermal accumulating layer. The temperature distribution of the heat generating assembly is shown by the solid line in FIG. 15, which shows that the distribution is more even than that shown by the broken line in the prior art embodiment.

Figure 12:
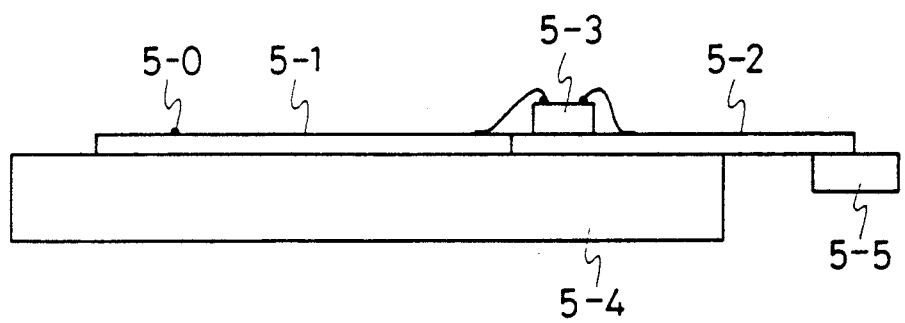
Figure 13:
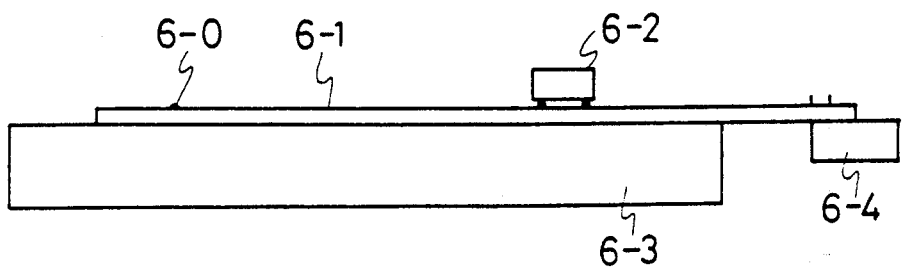

As shown in FIG. 12, a thermal head substrate 5-1 having a resistance heat generating portion 5-0 in accordance with the above embodiment and a printed board 5-2 having wiring for a driving IC and a connector 5-5 together are bonded or fixed to a heat releasing plate 5-4 by dual-sided tape, and a driving IC 5-3 mounted thereon is connected by the wire bonding technique or fixed by the face down bonding to assemble the thermal head. Also, an integrated thermal head can be manufactured by forming a heat generating portion 6-0 according to this embodiment and a circuit for connecting a driving IC on a single heat resistant insulating substrate 6-1 as a unity, installing a connector 6-4, and mounting a driving IC 6-2 by the face down bonding technique.

According to the present invention as implemented in this embodiment, a thermal head which can be manufactured at reduced cost of the material and manufacturing process, provide a high quality of printing, and is capable of arbitrarily adjusting various characteristics by altering the thicknesses of a thermal accumulating layer and a metal layer in a heat generating assembly without adding complex steps.

Embodiment 3

Figure 16:
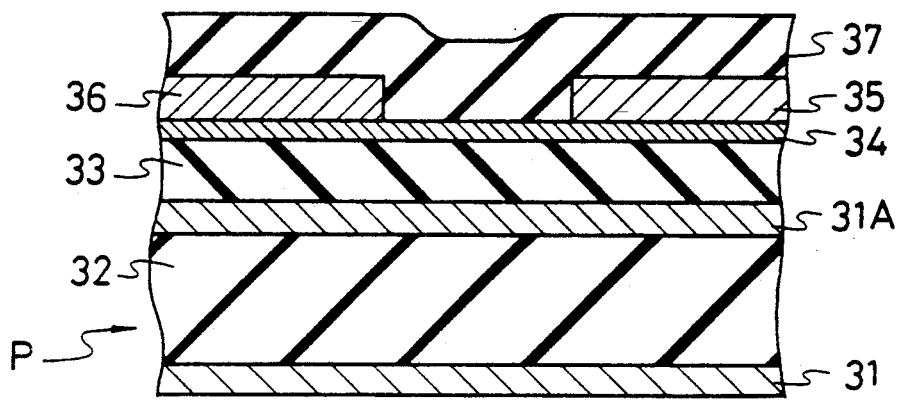
FIG. 16 is a sectional view showing a thermal head of still another embodiment according to the present invention.

FIG. 16 is a sectional view showing a major portion of a thermal head of still another embodiment. The thermal head employs a multi-layer substrate P filmed with copper on opposite sides and is manufactured in the following manner. A high heat resistance resin substrate 2 is 300 mm in length, 400 mm in width and 0.8 mm in thickness, and copper films 31A of thickness 3-5 μm is bonded to the opposite sides.

First, the copper film 31 is coated with a polyimide precursor with a solvent of N-methyl-pyrrolidone (NMP) to a predetermined thickness with a spin coater or a roll coater, dried at about 120° C. for several minutes, and then hardened for preparation at 200° C. for 30 minutes to form a polyimide layer.

Then, after the polyimide layer formed on one side of the multi-layer substrate P is patterned, the substrate P is heated in an oven or by infrared irradiation at about 300°-350° C. for about 30 minutes to form a polyimide resin thermal accumulating layer 33.

A heat generating resistor layer 34 is formed all over the surface by spattering and patterned by photoetching. On the patterned heat generating resistor layer 34, a common electrode 36 and a lead electrode 35 are made in a specific pattern. Eventually, a protection film 37 is formed by spattering, and thus, the thermal head is implemented.

Embodiment 4

Figure 17:
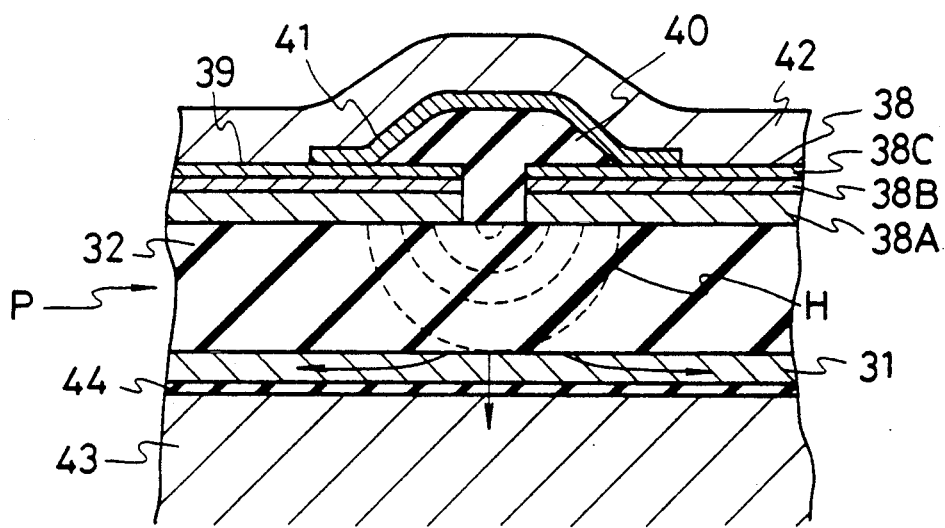
FIG. 17 is a sectional view showing a thermal head of yet another embodiment according to the present invention.

FIG. 17 is a sectional view showing a thermal head of yet another embodiment. The thermal head is manufactured in the following manner.

As in the previous embodiment, a multi-layer substrate P filmed with copper on opposite sides as a high heat resistant resin substrate is used. The copper film on one side is etched into a specified pattern by the photolithography to form a patterned copper layer 38. At this time, the copper film 31 on the bottom side is masked by tape or resist and left as it is.

Then, the copper layer 38 is overlaid with a nickel-phosphorus layer 38B of a thickness 1 μm and a gold plated layer 38C of a 0.1 μm thickness one after another by the electroless plating to form an electrode layer, or a common electrode 39 and a lead electrode 38.

Then, thereon the polyimide precursor is formed in the same way as in the previous embodiment, and the polyimide precursor is etched into a specific pattern to make a trapezoidal polyimide layer.

The polyimide precursor layer is heated in an oven or the infrared irradiation at 300°-400° C. for 30 minutes to make a trapezoidal polyimide resin thermal accumulating layer 40. At this time, because of the copper film 31 of good thermal conductivity on the rear side of the substrate, the cooling effect of the resin substrate 2 is enhanced, so that the deterioration and warping of the resin substrate 32 can be prevented.

Furthermore, a heat generating resistor layer 41 is formed by spattering, and a protection film 42 is formed by spattering. In this way, the thermal head is implemented.

Figure 18:
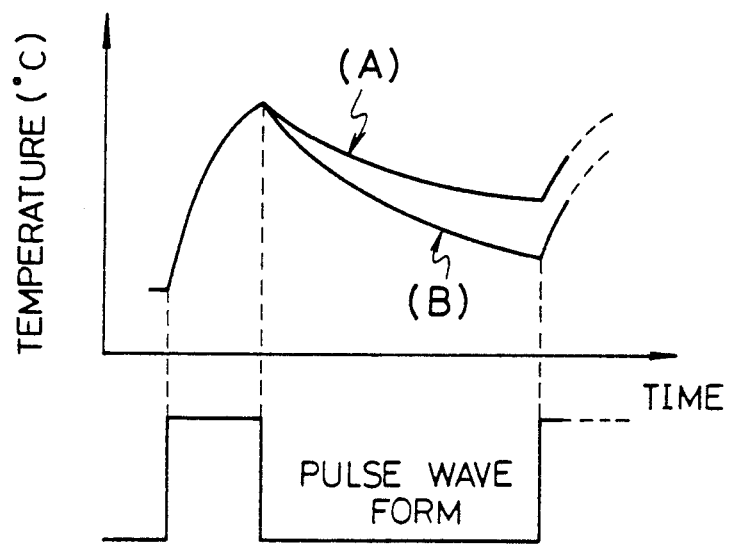
FIGS. 18 and 19 are diagrams showing temperature characteristics to applied pulses.
Figure 19:
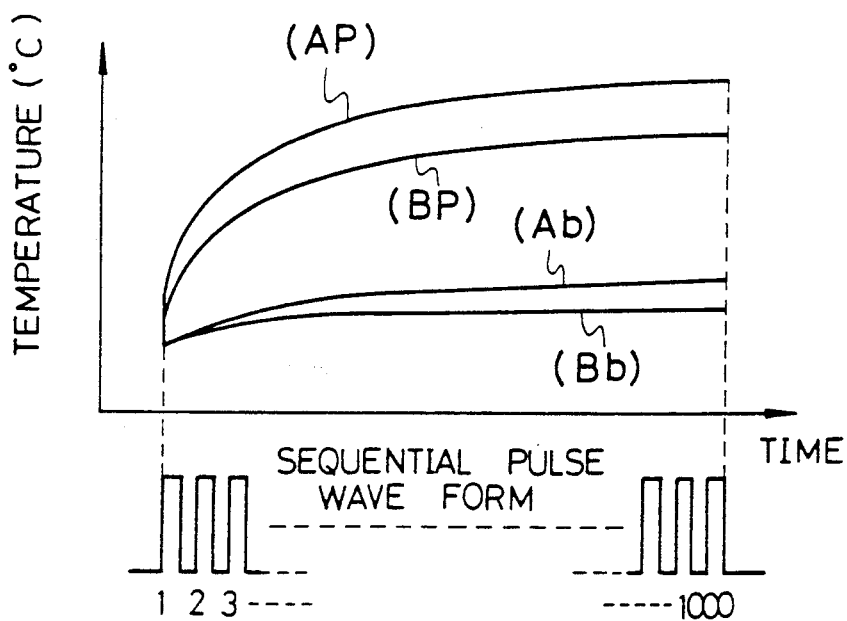

FIGS. 18 and 19 show the heat releasing characteristics when drive pulses are applied in the thermal head bonded by adhesive agent 44 to an aluminum heat releasing plate 43 (FIG. 17) and a thermal head without the copper film 31 on the rear side of the high heat resistant resin substrate 32 (compared sample).

FIG. 18 shows a variation with time in the surface temperature of the heat generating resistor layer when a single pulse is applied; (A) shows the result in the compared sample, while (B) shows the result in this embodiment. As will be recognized, with the copper film on the rear side of the substrate, even if a heat accumulating portion H (FIG. 2) locally appears in the polyimide resin thermal accumulating layer 40 and heat resistant resin substrate 32 under the heat generating resistor layer 41, the heat is rapidly released through the copper film 31 on the rear side of the substrate. Thus, the improved heat response characteristic is obtained.

FIG. 19 shows a variation with time in the peak temperature and base temperature when a sequential pulse is applied; (Ap) and (Ab) show the peak and base temperatures in the prior art embodiment, while (Bp) and (Bb) show the peak and base temperatures in this embodiment. Noting that both the peak and base temperatures come to be lower in the thermal head with the copper film 31 on the rear side of the substrate, it will be understood that the tailing phenomenon caused by the remaining heat in the heat generating resistor portion is improved.

Moreover, employing an adhesive paste of good thermal conductivity as the adhesive agent 44 bonding the heat releasing plate 43 tó the thermal head substrate in FIG. 17, the heat releasing characteristic can be further improved.

According to the present invention implemented in Embodiments 3 and 4, with a metal layer of good thermal conductivity provided on the rear side of a high heat resistant resin substrate, the heat response characteristic of a resistor portion generating heat when drive pulses are applied can be enhanced, and a high speed printing can be attained. The thermal diffusion is also improved, so that the tailing phenomenon can be prevented. Additionally, since a metal layer is employed as the rear surface of the substrate, the warping of the resin substrate itself is released in processing, the accuracy in a pattern processing is improved, and a fine patterning is facilitated. Thus, a thermal head of high reliability and moderate price can be provided.

What is claimed is:

1. A thermal head for a thermal recording machine comprising:
   an insulating substrate which is composed of a printed circuit board made of a heat resistant resin and covered with a copper film on a rear surface thereof wherein the copper film is a heat releasing metal layer;
   a plurality of thermal resistors disposed on a front surface of said insulating substrate in a direction corresponding to scanning;

a plurality of discrete electrodes electrically connecting first ends of said plurality of thermal resistors to a control element;

a common electrode electrically connecting second ends of said plurality of thermal resistors together;

a heat releasing layer formed of copper film on the front surface of said insulating substrate beneath each of said plurality of thermal resistors; and a thermal accumulating layer of a polyimide resin covering said heat releasing layer.

2. The thermal head according to claim 1, wherein an inorganic material layer having a thermal diffusivity larger than that of the thermal resistors is interposed between said plurality of thermal resistors and said thermal accumulating layer.

3. The thermal head according to claim 2, wherein said inorganic material layer is an $SiO_2$ film.

4. The thermal head according to claim 1, wherein the copper film on the front surface of said insulating substrate is connected to said plurality of discrete electrodes and said common electrode.

5. A thermal head comprising:

a heat resistant resin substrate;

a thermal accumulating layer of a heat resistant resin formed on a front surface of said resin substrate;

a thermal resistor layer formed on said thermal accumulating layer;

an electrode layer formed on the front surface of said resin substrate for conducting electricity to said thermal resistor layer;

a heat releasing metal layer formed of copper film on a front surface of said resin substrate beneath said thermal resistor layer, said heat releasing metal layer being connected to said electrode layer for releasing heat therefrom;

a protective layer formed on said thermal resistor layer and said electrode layer; and a metal layer formed on a rear surface of said resin substrate for releasing heat from said thermal head.

6. The thermal head according to claim 5, wherein said metal layer is a copper film.

7. The thermal head according to claim 5, wherein an inorganic material layer having a thermal diffusivity larger than that of the thermal resistor layer is interposed between said thermal resistor layer and said thermal accumulating layer.

* * * * *